(12) United States Patent
Masuoka

(10) Patent No.: US 6,217,357 B1
(45) Date of Patent: Apr. 17, 2001

(54) METHOD OF MANUFACTURING TWO-POWER SUPPLY VOLTAGE COMPATIBLE CMOS SEMICONDUCTOR DEVICE

(75) Inventor: Sadaaki Masuoka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/378,728

(22) Filed: Aug. 23, 1999

(30) Foreign Application Priority Data

Aug. 25, 1998 (JP) .................................................. 10/238396

(51) Int. Cl.⁷ .............................................. H01L 21/8234
(52) U.S. Cl. ....................... 439/199; 438/149; 438/152; 438/166; 438/231; 438/238; 438/295
(58) Field of Search ..................................... 438/149, 152, 438/199, 166, 231, 238, 295, 297, 298, 302, 305, 382

(56) References Cited

U.S. PATENT DOCUMENTS

| 5,128,274 | * | 7/1992 | Yabu et al. | ........................... 438/452 |
| 5,570,311 | * | 10/1996 | Ema et al. | ........................... 365/154 |
| 5,930,638 | * | 7/1999 | Reedy et al. | ........................... 438/382 |
| 6,051,509 | * | 4/2000 | Tsuchiaki | ........................... 438/758 |

\* cited by examiner

Primary Examiner—David Nelms
Assistant Examiner—Reneé R Berry
(74) Attorney, Agent, or Firm—Sughrue, Mion, Zinn, Macpeak & Seas, PLLC

(57) ABSTRACT

In a method of manufacturing a two-type power supply voltage compatible CMOS semiconductor, the number of photolithography steps that aim at forming an LDD, a pocket, and a source/drain region is reduced so that time and cost are economized. For this purpose, an LDD structure of a low power supply voltage compatible portion and an LDD structure of a high power supply voltage compatible portion are formed at once and not separately.

10 Claims, 12 Drawing Sheets

METHOD OF MANUFACTURING TWO-POWER SUPPLY VOLTAGE COMPATIBLE CMOS SEMICONDUCTOR DEVICE

BACKGROUND OF THE INVENTION

1. Field of the Invention

The present invention relates to a semiconductor device manufacturing method and, more particularly, to a method of manufacturing a two-power supply voltage compatible CMOS semiconductor device in which the number of photolithography steps for forming an LDD, a pocket, and a source/drain region can be reduced as compared with the prior art.

2. Description of the Prior Art

As a CMOS semiconductor device is more and more micropatterned, its gate length decreases. Accordingly, it is indispensable to suppress a decrease in threshold voltage, i.e., a so-called short-channel effect, and a degradation in hot carriers of mainly an n-type MOSFET. For this purpose, the power supply voltage must be decreased.

In the circuit configuration, it is also necessary to form a MOSFET compatible with the previous-generation power supply voltage at the interface with an external circuit.

From the above reasons, in a CMOS semiconductor device, MOSFETs each compatible with two different power supply voltages, i.e., four types of MOSFETs including a low power supply voltage compatible n-type MOSFET, a low power supply voltage compatible p-type MOSFET, a high power supply voltage compatible n-type MOSFET, and a high power supply voltage compatible p-type MOSFET, must be formed separately on the wafer. Items required for the four types of MOSFETs are as follows.

Since a low power supply voltage compatible MOSFET portion is expected to operate at a high speed, a device must have a small gate length and a high drive capability. Accordingly, a structure capable of suppressing the short-channel effect and having a low parasitic resistance for increasing the drive capability is required.

Since a high power supply voltage compatible MOSFET portion is generally used at only the interface with an external circuit, its drive capability does not matter. Accordingly, a MOSFET having a large gate length is generally used, and suppression of the short-channel effect does not generally become an issue. Since the power supply voltage is high, a degradation in reliability such as hot carrier resistance, and suppression of the junction leakage current between the source/drain and the well pose problems.

Even if the low power supply voltage compatible MOSFET and the high power supply voltage compatible MOSFET are formed on the same wafer, they require separate LDD structures and source/drain structures.

More specifically, low power supply voltage compatible n- and p-type MOSFETs preferably have structures each employing both a comparatively heavily doped LDD layer and a pocket layer in order to satisfy both suppression of the short-channel effect and decrease in parasitic resistance. A high power supply voltage compatible n-type MOSFET must have a lightly doped LDD structure in order to improve the hot carrier resistance. A high power supply voltage compatible p-type MOSFET must have a structure that can suppress the leakage current between the source/drain and the well.

A conventional method of manufacturing a CMOS semiconductor device compatible with two different power supply voltages will be described with reference to FIGS. 1A to 1H. As this prior art, a case wherein the low power supply voltage is 1.8 V and the high power supply voltage is 3.3 V will be described. In the description, the gate length of the 1.8 –V compatible MOSFET is 0.18 $\mu$m as the typical example, and the gate length of the 3.3 –V compatible MOSFET is 0.35 $\mu$m as the typical example.

As shown in FIG. 1A, isolation regions 2, n-type well regions 3, and p-type well regions 4 are formed in a semiconductor substrate 1. After that, 1.8 –V power supply voltage compatible thin gate oxide films 5 and 3.3 –V power supply voltage compatible thick gate oxide films 6 are formed.

The gate oxide films 5 and 6 having the two different thicknesses are usually formed in the following manner. A gate oxide film having an appropriate thickness is formed once, and only its 1.8 –V power supply voltage portion is wet-etched to remove the gate oxide film. After that, gate oxidation is performed again for a thickness matching the design of the 1.8 –V power supply voltage portion. The 3.3 –V power supply voltage portion is subjected to gate oxidation twice. The thickness of the first gate oxidation is adjusted so that a gate oxide film having a 3.3 –V power supply voltage compatible thickness is formed (not shown). After that, a gate electrode material is deposited, and photolithography and etching are performed to form gate electrodes 7.

After that, as shown in FIG. 1B, a portion of the substrate 1 other than a prospective 1.8 –V power supply voltage compatible n-type MOSFET formation region 11 is masked with resists 12 (first photolithography step), and an n-type impurity, e.g., As$^+$ 13, is ion-implanted at a comparatively high concentration to form an n-type LDD region 14. After that, a p-type impurity, e.g., BF$_2^+$ 15, is obliquely ion-implanted to form a p-type pocket region 16.

The 1.8 –V power supply voltage compatible n-type MOSFET is a micropatterned portion having a gate length of 0.18 $\mu$m, and it needs a decrease in parasitic resistance and suppression of the short-channel effect. The former is realized by setting the n-type LDD region to have a comparatively high As concentration on the order of about $10^{19}$ cm$^{-3}$. The latter is realized by setting the pocket region to have a boron concentration on the order of about $10^{18}$ cm$^{-3}$.

The resists 12 are removed. As shown in FIG. 1C, a portion of the substrate 1 other than a prospective 1.8 –V power supply voltage compatible p-type MOSFET formation region 17 is masked with resists 18 (second photolithography step). After that, a p-type impurity, e.g., BF$_2^+$ 19, is ion-implanted at a comparatively high concentration to form a p-type LDD region 20. Then, an n-type impurity, e.g., As$^+$ 21, is obliquely ion-implanted to form an n-type pocket region 22.

The 1.8 –V power supply voltage compatible p-type MOSFET is a micropatterned portion having a gate length of 0.18 $\mu$m, and it needs a decrease in parasitic resistance and suppression of the short-channel effect. The former is realized by setting the p-type LDD region to have a comparatively high boron concentration on the order of about $10^{19}$ cm$^{-3}$. The latter is realized by setting the pocket region to have an As concentration on the order of about $10^{18}$ cm$^{-3}$.

The resists 18 are removed. As shown in FIG. 1D, a portion of the substrate 1 other than a prospective 3.3 –V power supply voltage compatible n-type MOSFET formation region 23 is masked with resists 24 (third photolithography step). After that, an n-type impurity, e.g., P$^+$ 25, is ion-implanted at a comparatively low concentration to form an n-type LDD region 26.

The 3.3 −V power supply voltage compatible n-type MOSFET is a region having a large gate length of 0.35 μm, and a short-channel effect does not occur. Accordingly, pocket implantation is not necessary. Since this region has a large gate length, its parasitic resistance does not pose a problem.

Since the power supply voltage is high, the hot carrier must be suppressed. Accordingly, the n-type LDD region 26 must be formed by using broad-profile P⁺ 25 to a low concentration on the order of about $10^{18}$ cm$^{-3}$.

The resists 24 are removed. As shown in FIG. 1E, a portion of the substrate 1 other than a prospective 3.3 −V power supply voltage compatible p-type MOSFET formation region 27 is masked with resists 28 (fourth photolithography step). After that, a p-type impurity, e.g., BF$_2$⁺ 29, is ion-implanted to form a p-type LDD region 30.

The 3.3 −V power supply voltage compatible p-type MOSFET is a region having a large gate length of 0.35 μm, and a short-channel effect does not occur. Accordingly, pocket implantation is not necessary. If pocket implantation is performed, the junction leakage current between the source/drain region and the well region increases. Thus, pocket implantation is not preferably performed.

The resists 28 are removed, and side walls 31 composed of oxide films are formed, as shown in FIG. 1F.

After that, as shown in FIG. 1G, the prospective 1.8 −V power supply voltage compatible p-type MOSFET formation region 17 and prospective 3.3 −V power supply voltage compatible p-type MOSFET formation region 27 are masked with resists 32 (fifth photolithography step), and an n-type impurity, e.g., As⁺ 33, is ion-implanted at a high concentration to form n-type source/drain regions 34.

The resists 32 are removed. As shown in FIG. 1H, the prospective 1.8 −V power supply voltage compatible n-type MOSFET formation region 11 and prospective 3.3 −V power supply voltage compatible n-type MOSFET formation region 23 are masked with resists 35 (sixth photolithography step), and a p-type impurity, e.g., B⁺ 36, is ion-implanted at a high concentration to form p-type source/drain regions 37.

The resists 35 are removed, and the source/drain regions are annealed for activation. After that, a silicide layer, an interlevel insulating film, interconnections, and the like are formed to complete a CMOS semiconductor device.

According to the prior art shown in FIGS. 1A to 1H, since the 1.8 −V power supply voltage compatible n-type MOSFET and the 1.8 −V power supply voltage compatible p-type MOSFET have comparatively heavily doped LDD regions, they can sufficiently decrease the parasitic resistance to allow expectation for a high drive current. Since these MOSFETs have pocket structures, they can sufficiently suppress the short-channel effect even at a microregion having a gate length of 0.18 μm. Since the 3.3 −V power supply voltage compatible n-type MOSFET uses low-concentration, broad-profile phosphor to form the LDD, it can sufficiently suppress the hot-carrier effect even when a high power supply voltage of 3.3 V is used. The 3.3 −V power supply voltage compatible p-type MOSFET does not have a pocket region, unlike the 1.8 −V power supply voltage compatible p-type MOSFET. Thus, the junction leakage current between the source/drain region and the well region does not increase even when a high power supply voltage of 3.3 V is used.

In this manner, according to the method of manufacturing a two-power supply voltage compatible CMOS semiconductor device shown in FIGS. 1A to 1H, the optimum LDD, pocket, and source/drain structure can be formed in the four types of MOSFETs. On the other hand, however, photolithography is required a total of six times to form the LDDs, pockets, and source/drain regions. This is because, since separate LDD structures are formed for the low power supply voltage portions and the high power supply voltage portions, photolithography must be performed separately for the separate LDD structures. The increase in number of photolithography steps leads to an increase in manufacturing cost, and must be solved by all means.

Another conventional method of manufacturing a CMOS semiconductor device compatible with two different power supply voltages will be described with reference to FIGS. 2A to 2H. As this prior art, a case wherein the low power supply voltage is 1.8 V and the high power supply voltage is 3.3 V will be described. In the description, the gate length of the 1.8 −V power supply compatible MOSFET is 0.18 μm as the typical example, and the gate length of the 3.3 −V power supply compatible MOSFET is 0.35 μm as the typical example.

As shown in FIG. 2A, isolation regions 52, n-type well regions 53, and p-type well regions 54 are formed in a semiconductor substrate 51. After that, 1.8 −V power supply voltage compatible thin gate oxide films 55 and 3.3 −V power supply voltage compatible thick gate oxide films 56 are formed.

The gate oxide films 55 and 56 having the two different thicknesses are usually formed in the following manner. A gate oxide film having an appropriate thickness is formed once, and only its 1.8 −V power supply voltage portion is wet-etched to remove the gate oxide film. After that, gate oxidation is performed again for a thickness matching the design of the 1.8 −V power supply voltage portion. The 3.3 −V power supply voltage portion is subjected to gate oxidation twice. The thickness of first gate oxidation is adjusted so that a gate oxide film having a 3.3 −V power supply voltage compatible thickness is formed (not shown). After that, a gate electrode material is deposited, and photolithography and etching are performed to form gate electrodes 57.

After that, as shown in FIG. 2B, a portion of the substrate 51 other than a prospective 1.8 −V power supply voltage compatible n-type MOSFET formation region 61 is masked with resists 62 (first photolithography step), and an n-type impurity, e.g., As⁺ 63, is ion-implanted at a comparatively high concentration to form an n-type LDD region 64. After that, a p-type impurity, e.g., BF$_2$⁺ 65, is obliquely ion-implanted to form a p-type pocket region 66.

The 1.8 −V power supply voltage compatible n-type MOSFET is a micropatterned portion having a gate length of 0.18 μm, it needs a decrease in parasitic resistance and suppression of the short-channel effect. The former is realized by setting the n-type LDD region to have a comparatively high As concentration on the order of about $10^{19}$ cm$^{-3}$. The latter is realized by setting the pocket region to have a boron concentration on the order of about $10^{16}$ cm$^{-3}$.

The resists 62 are removed. As shown in FIG. 2C, a portion of the substrate 51 other than a prospective 1.8 −V power supply voltage compatible p-type MOSFET formation region 67 is masked with resists 68 (second photolithography step). After that, a p-type impurity, e.g., BF$_2$⁺ 69, is ion-implanted at a comparatively high concentration to form a p-type LDD region 70. Then, an n-type impurity, e.g., As⁺ 71, is obliquely ion-implanted to form an n-type pocket region 72.

The 1.8 −V power supply voltage compatible p-type MOSFET is a micropatterned portion having a gate length of 0.18 μm, and it needs a decrease in parasitic resistance and suppression of the short-channel effect. The former is realized by setting the p-type LDD region to have a comparatively high boron concentration on the order of about $10 cm^{-3}$. The latter is realized by setting the pocket region to have an As concentration on the order of about $10 cm^{-3}$.

The resists 68 are removed, and side walls 73 composed of oxide films are formed, as shown in FIG. 2D.

After that, as shown in FIG. 2E, a portion of the substrate 51 other than the prospective 1.8 –V power supply voltage compatible n-type MOSFET formation region 61 is masked with resists 74 (third photolithography step), and an n-type impurity, e.g., $As^+$ 75, is ion-implanted to a high concentration to form an n-type source/drain region 76.

The resists 74 are removed. As shown in FIG. 2F, a portion of the substrate 51 other than the prospective 1.8 –V power supply voltage compatible p-type MOSFET formation region 67 is masked with resists 77 (fourth photolithography step), and a p-type impurity, e.g., $B^+$ 78, is ion-implanted at a high concentration to form a p-type source/drain region 79.

The resists 77 are removed. As shown in FIG. 2G, a portion of the substrate 51 other than a prospective 3.3 –V power supply voltage compatible n-type MOSFET formation region 80 is masked with resists 81 (fifth photolithography step), and n-type impurities, e.g., $P^+$ 82 and $As^+$ 83, are ion-implanted to form a DDD structure, having a comparatively lightly doped, broad-profile phosphorus region 85, outside an n-type As source/drain region 84.

The resists 81 are removed. As shown in FIG. 2H, a portion of the substrate 51 other than a prospective 3.3 –V power supply voltage compatible p-type MOSFET formation region 87 is masked with resists 88 (sixth photolithography step), and a p-type impurity, e.g., $B^+$ 89, is ion-implanted at a high concentration to form a p-type source/drain region 90.

The resists 88 are removed, and the source/drain regions are annealed for activation. After that, a silicide layer, an interlevel insulating film, interconnections, and the like are formed to complete a CMOS semiconductor device.

According to the prior art shown in FIGS. 2A to 2H, since the 1.8 –V power supply voltage compatible n-type MOSFET and the 1.8 –V power supply voltage compatible p-type MOSFET have comparatively heavily doped LDD regions, they can sufficiently decrease the parasitic resistance to allow expectation for a high drive current. Since these MOSFETs have pocket structures, they can sufficiently suppress the short-channel effect even at a microregion having a gate length of 0.18 μm. Since the 3.3 –V power supply voltage compatible n-type MOSFET uses low-concentration, broad-profile phosphorus to form the LDD, it can sufficiently suppress the hot-carrier effect even when a high power supply voltage of 3.3 V is used. The 3.3 –V power supply voltage compatible p-type MOSFET does not have a pocket region, unlike the 1.8 –V power supply voltage compatible p-type MOSFET. Thus, the junction leakage current between the source/drain region and the well region does not increase even when a high power supply voltage of 3.3 V is used.

According to the method of manufacturing a two-power supply voltage compatible CMOS semiconductor device shown in FIGS. 2A to 2H, however, photolithography is required a total of six times to form the LDDs, pockets, and source/drain regions, in the same manner as in the prior art shown in FIGS. 1A to 1H. This is because, since separate LDD structures are formed for the low power supply voltage portions and the high power supply voltage portions, photolithography must be performed separately for the separate LDD structures. The increase in number of photolithography steps leads to an increase in manufacturing cost, and must be solved by all means.

As has been described above, when forming a CMOS semiconductor device compatible with two different power supply voltages so its internal circuit operates at 1.8 V while its an interface with an external circuit operates at 3.3 V, the 1.8 –V power supply voltage compatible MOSFETs must have an LDD structure, a pocket structure, and a source/drain structure appropriate for a smaller channel length and a high ion concentration. The 3.3 –V power supply voltage compatible MOSFETs must have an LDD structure and a source/drain structure that can suppress a degradation in reliability, e.g., the hot-carrier effect.

When forming four types of MOSFETs including n-type MOSFETs and p-type MOSFETs each compatible with the two different power supply voltages, conventionally, six photolithography steps are required to form LDD regions, pocket regions, and source/drain regions that are optimum for these four types of transistors.

SUMMARY OF THE INVENTION

The present invention has been made in consideration of the above situation in the prior art, and has as object to provide a semiconductor device manufacturing method in which, when forming a CMOS semiconductor device compatible with two different power supply voltages, the number of photolithography steps required for forming LDDs, pockets, and source/drain regions can be reduced from six time in a conventional method to four time.

In order to achieve the above object, with the semiconductor device manufacturing method according to the present invention, low power supply voltage compatible LDD structures and high power supply voltage compatible LDD structures are formed not separately but at once. Practical aspects for realizing this method are as follows.

According to the present invention, there is provided a semiconductor device manufacturing method comprising:

the first step of forming a plurality of isolation regions in a semiconductor substrate, and thereafter forming a first p-type well region for a low power supply voltage compatible n-type MOSFET, a first n-type well region for a low power supply voltage compatible p-type MOSFET, a second p-type well region for a high power supply voltage compatible n-type MOSFET, and a second n-type well region for a high power supply voltage compatible p-type MOSFET that are isolated by the isolation regions;

after the first step, the second step of forming a gate oxide film to cover upper surfaces of the first n- and p-type well regions and the second n- and p-type well regions, depositing a polysilicon film on an upper surface of the gate oxide film, and forming gate electrodes by dry etching;

after the second step, the third step of ion-implanting a p-type impurity to an entire surface of the semiconductor substrate to form p-type impurity regions in the first n- and p-type well regions and in the second n- and p-type well regions to serve as a prospective low power supply voltage compatible n-type MOSFET formation region, a prospective low power supply voltage compatible p-type MOSFET formation region, a prospective high power supply voltage compatible n-type MOSFET formation region, and a prospective high power supply voltage compatible p-type MOSFET formation region, respectively, and ion-implanting an n-type impurity to the entire surface of the semiconductor substrate to form n-type impurity regions under the p-type impurity regions;

after the third step, the fourth step of masking the prospective low power supply voltage compatible p-type MOSFET formation region and the prospective high power supply voltage compatible p-type MOSFET formation region with resists by a first photolithography step, ion-implanting an n-type impurity to invert the p-type impurity region in the prospective low power supply voltage compatible n-type MOSFET formation region and the p-type impurity region in the prospective high power supply voltage compatible n-type MOSFET formation region to n-type impurity regions, and ion-implanting a p-type impurity to invert the n-type impurity region in the prospective low power supply voltage compatible n-type MOSFET formation region and the n-type impurity region in the prospective high power supply voltage compatible n-type MOSFET formation region to p-type impurity regions;

after the fourth step, the fifth step of removing the resists formed in the fourth step, and forming double side walls, each constituted by first and second side walls, at the prospective low power supply voltage compatible n-type MOSFET formation region, the prospective low power supply voltage compatible p-type MOSFET formation region, the prospective high power supply voltage compatible n-type MOSFET formation region, and the prospective high power supply voltage compatible p-type MOSFET formation region;

after the fifth step, the sixth step of masking the prospective low power supply voltage compatible p-type MOSFET formation region and the prospective low power supply voltage compatible n-type MOSFET formation region with resists by a second photolithography step, and removing the second side walls on the prospective high power supply voltage compatible n-type MOSFET formation region and in the prospective high power supply voltage compatible p-type MOSFET formation region by wet etching;

after the sixth step, the seventh step of removing the resists formed in the sixth step, masking the prospective low power supply voltage compatible p-type MOSFET formation region and the prospective high power supply voltage compatible p-type MOSFET formation region with resists by a third photolithography step, and forming a DDD structure composed of an $n^-$-type impurity region and an $n^+$-type impurity region in the prospective high power supply voltage compatible n-type MOSFET formation region by impurity ion implantation, while forming a structure, in which the n- and p-type impurity regions formed in the fourth step exist near a gate end in the prospective low power supply voltage compatible n-type MOSFET formation region;

after the seventh step, the eighth step of removing the resists formed in the seventh step, masking the prospective low power supply voltage compatible n-type MOSFET formation region and the prospective high power supply voltage compatible n-type MOSFET formation region with resists by a fourth photolithography step, forming p-type source/drain regions in the prospective low power supply voltage compatible p-type MOSFET formation region and in the prospective high power supply voltage compatible p-type MOSFET formation region, and a single drain structure in the prospective high power supply voltage compatible p-type MOSFET formation region, by impurity ion implantation, while forming a structure, in which the p- and n-type impurity regions formed in the third step exist near the gate end in the prospective low power supply voltage compatible p-type MOSFET formation region; and after the eighth step, the ninth step of removing the resists formed in the eighth step, and performing annealing for activation.

According to the second aspect of the present invention, there is provided a semiconductor device manufacturing method comprising:

the first step of forming an isolation region in a semiconductor substrate, and thereafter forming a first p-type well region for a low power supply voltage compatible n-type MOSFET, a first n-type well region for a low power supply voltage compatible p-type MOSFET, a second p-type well region for a high power supply voltage compatible n-type MOSFET, and a second n-type well region for a high power supply voltage compatible p-type MOSFET that are isolated by the isolation region;

after the first step, the second step of forming a gate oxide film to cover upper surfaces of the first n- and p-type well regions and the second n- and p-type well regions, depositing a polysilicon film on an upper surface of the gate oxide film, and forming gate electrodes by dry etching;

after the second step, the third step of ion-implanting a p-type impurity to an entire surface of the semiconductor substrate to form p-type impurity regions in the first n- and p-type well regions and in the second n- and p-type well regions to serve as a prospective low power supply voltage compatible n-type MOSFET formation region, a prospective low power supply voltage compatible p-type MOSFET formation region, a prospective high power supply voltage compatible n-type MOSFET formation region, and a prospective high power supply voltage compatible p-type MOSFET formation region, respectively;

after the third step, the fourth step of forming a first insulating film on the entire surface of the semiconductor substrate, depositing a second insulating film, and etching-back the second insulating film by RIE to form first side walls;

after the fourth step, the fifth step of masking the prospective low power supply voltage compatible n-type MOSFET formation region and the prospective high power supply voltage compatible p-type MOSFET formation region with resists by a first photolithography step, removing the first side walls on the prospective low power supply voltage compatible p-type MOSFET formation region and on the prospective high power supply voltage compatible n-type MOSFET formation region by wet etching, and thereafter ion-implanting an n-type impurity to form n-type impurity regions in the prospective low power supply voltage compatible p-type MOSFET formation region and the prospective high power supply voltage compatible n-type MOSFET formation region;

after the fifth step, the sixth step of removing the resists formed in the fifth step, masking the prospective low power supply voltage compatible p-type MOSFET formation region and the prospective high power supply voltage compatible p-type MOSFET formation region with resists by a second photolithography step, and forming a lightly doped, broad-profile n-type LDD region at a gate end of the prospective high power supply voltage compatible n-type MOSFET formation region by impurity ion implantation, while forming a lightly doped, broad-profile n-type impurity region not reaching the gate end in the prospective low power supply voltage compatible n-type MOSFET formation region;

after the sixth step, the seventh step of removing the first side wall on the prospective low power supply voltage compatible n-type MOSFET formation region by wet etching, ion-implanting an n-type impurity to form n-type impurity regions in the prospective low power supply voltage compatible n-type MOSFET formation region and in the prospective high power supply voltage compatible n-type MOSFET formation region, and thereafter ion-implanting a p-type impurity at a concentration lower than in the n-type LDD region to form a p-type impurity region in the prospective low power supply voltage compatible n-type MOSFET formation region;

after the seventh step, the eighth step of removing the resists formed in the sixth step, and removing the first side wall on the prospective high power supply voltage compatible p-type MOSFET formation region;

after the eighth step, the ninth step of depositing an $SiO_2$ film on the entire surface of the semiconductor substrate, etching back the $SiO_2$ film by RIE to form second side walls, thereafter masking the prospective low power supply voltage compatible p-type MOSFET formation region and the prospective high power supply voltage compatible p-type MOSFET formation region with resists by a third photolithography step, and ion-implanting an impurity to form n-type source/drain regions in the prospective low power supply voltage compatible n-type MOSFET formation region and in the prospective high power supply voltage compatible n-type MOSFET formation region;

after the ninth step, the 10th step of removing the resists formed in the eighth step, masking the prospective low power supply voltage compatible n-type MOSFET formation region and the prospective high power supply voltage compatible n-type MOSFET formation region with resists by a fourth photolithography step, and forming p-type source/drain regions in the prospective low power supply voltage compatible p-type MOSFET formation region and in the prospective high power supply voltage compatible p-type MOSFET formation region by impurity ion implantation; and after the 10th step, the 11th step of removing the resists formed in the 10th step, and performing annealing for activation.

As is apparent from the above aspects, according to the first aspect of the present invention, the 1.8 –V power supply voltage compatible n-type MOSFET has a comparatively heavily doped LDD region and a pocket region. By using the comparatively heavily doped LDD structure, the 1.8 –V power supply voltage compatible MOSFET can reduce its parasitic resistance, so that a high drive current can be obtained.

Since a pocket structure is used, the short-channel effect can be sufficiently suppressed even at a microregion having a gate length of 0.18 µm.

In the 3.3 –V power supply voltage compatible n-type MOSFET, the As source/drain region is surrounded by a comparatively lightly doped, broad-profile phosphorus region. Thus, a degradation in hot carrier can be sufficiently suppressed even when a high power supply voltage of 3.3 V is used.

The 3.3 –V power supply voltage compatible p-type MOSFET does not have a pocket structure, unlike the 1.8 –V power supply voltage compatible p-type MOSFET. Thus, the junction leakage current between the source/drain region and the well region does not increase even when a high power supply voltage of 3.3 V is used.

In this manner, according to the first aspect of the present invention, the LDDs, pockets, and source/drain structures optimum for the four types of MOSFETs can be formed with four photolithography steps. As compared to the prior art, the number of photolithography steps can be reduced by two.

According to the second aspect of the present invention, the 1.8 –V power supply voltage compatible n-type MOSFET has a comparatively heavily doped LDD region and a pocket region. By using the comparatively heavily doped LDD structure, the 1.8 –V power supply voltage compatible MOSFET can sufficiently decrease the parasitic resistance to obtain a high drive current.

Since this MOSFET uses a pocket structure, it can sufficiently suppress the short-channel effect even at a microregion having a gate length of 0.18 µm.

Since the 3.3 –V power supply voltage compatible n-type MOSFET uses low-concentration, broad-profile phosphorus to form the LDD region, it can sufficiently suppress a degradation in hot carrier even when a high power supply voltage of 3.3 V is used.

The 3.3 –V power supply voltage compatible p-type MOSFET does not have a pocket region, unlike the 1.8 –V power supply voltage compatible p-type MOSFET. Thus, the junction leakage current between the source/drain region and the well region does not increase even when a high power supply voltage of 3.3 V is used.

As described above, according to the second aspect of the present invention, the LDDs, pockets, and source/drain structures optimum for the four types of MOSFETs can be formed with four photolithography steps. As compared to the prior art, the number of photolithography steps can be reduced by two.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF THE PREFERRED EMBODIMENTS

Several preferred embodiments of the present invention will be described in detail with reference to the accompanying drawings.

FIGS. 3A to 3H are sectional views showing a method of manufacturing a two-power supply voltage compatible CMOS semiconductor device according to the first embodiment of the present invention in the order of the manufacturing steps.

The first embodiment describes a case wherein 1.8 V and 3.3 V are used as the two different power supply voltages. In the description, the low power supply voltage region has a gate length of 0.18 μm, and the high power supply voltage region has a gate length of 0.35 μm.

Figure 1A:
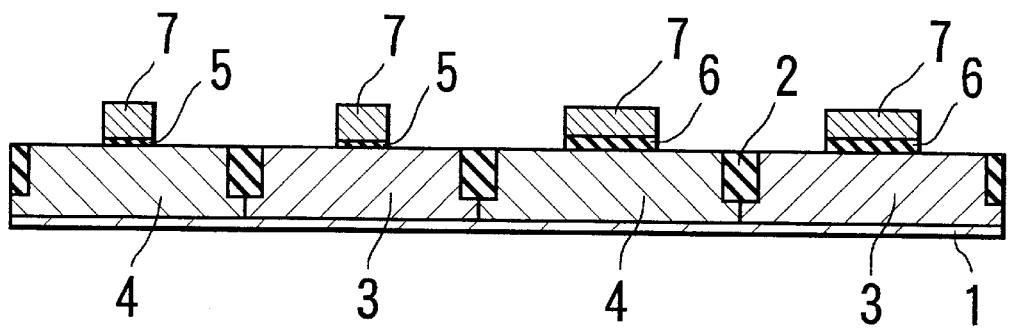
FIGS. 1A to 1H are sectional views showing a conventional semiconductor device manufacturing method in the order of the steps.
Figure 1B:
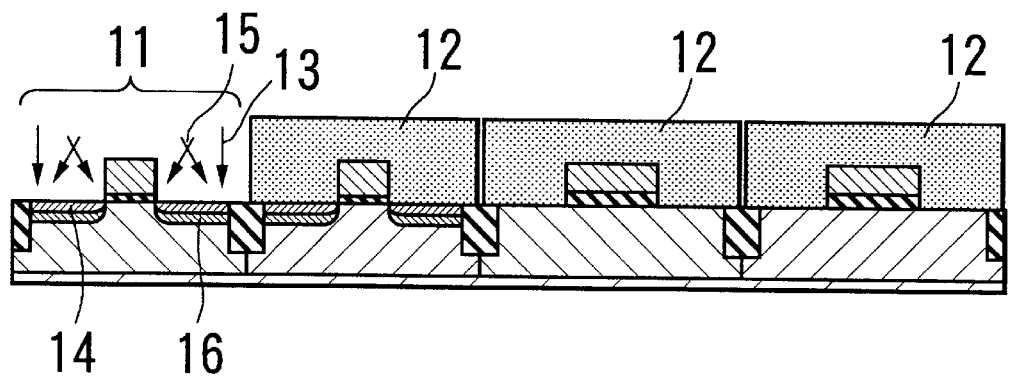
Figure 1C:
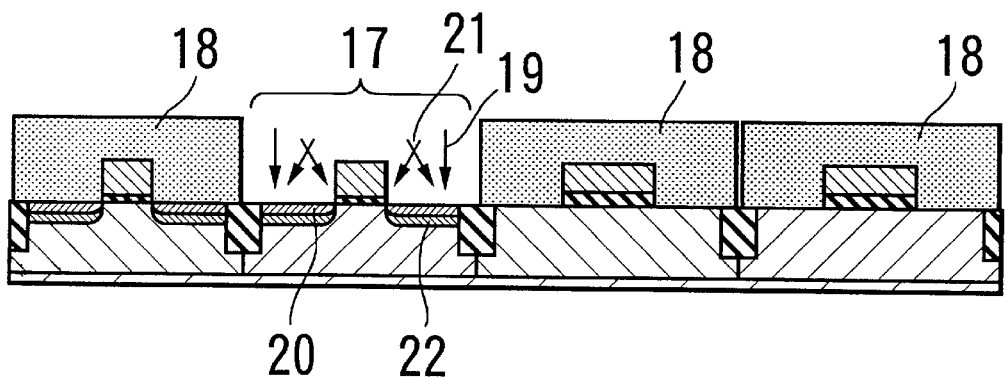
Figure 1D:
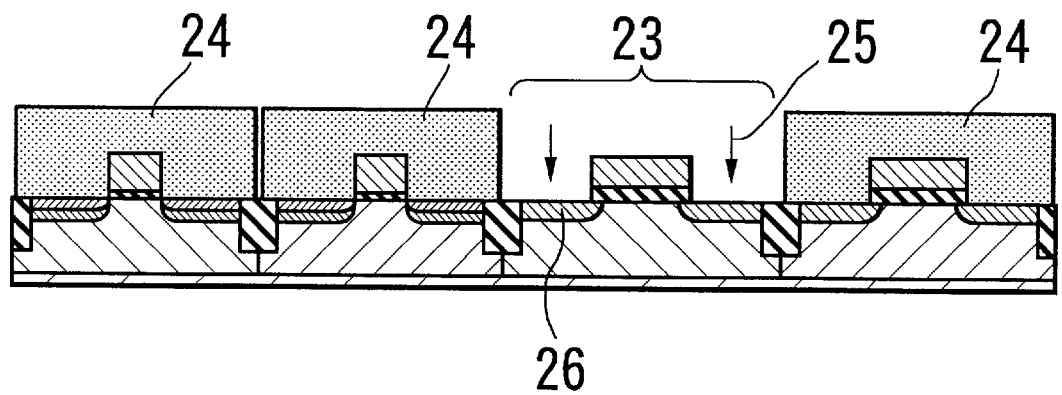
Figure 1E:
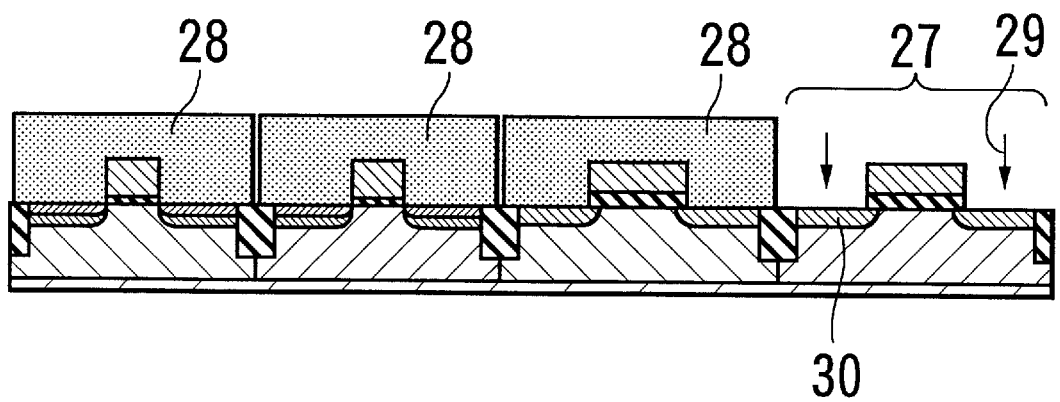
Figure 1F:
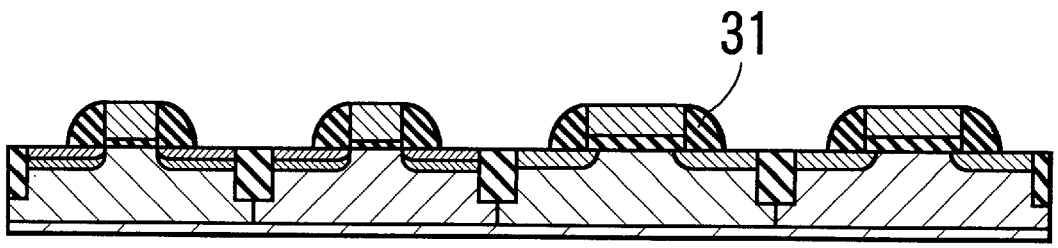
Figure 1G:
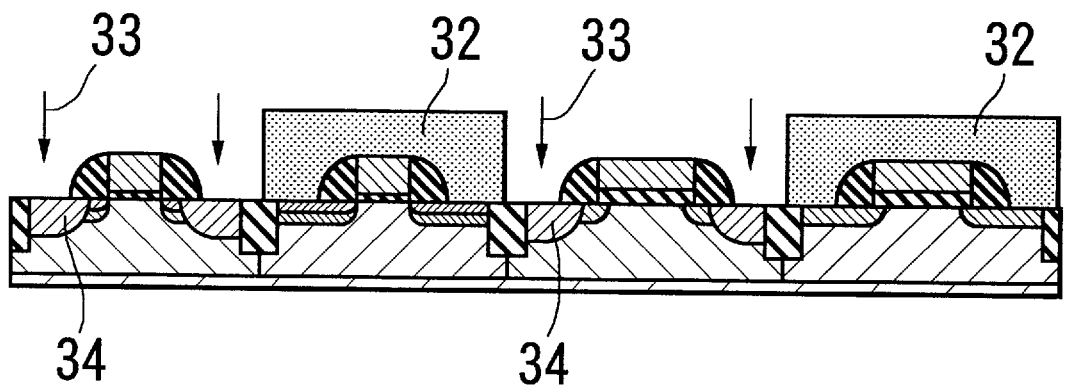
Figure 1H:
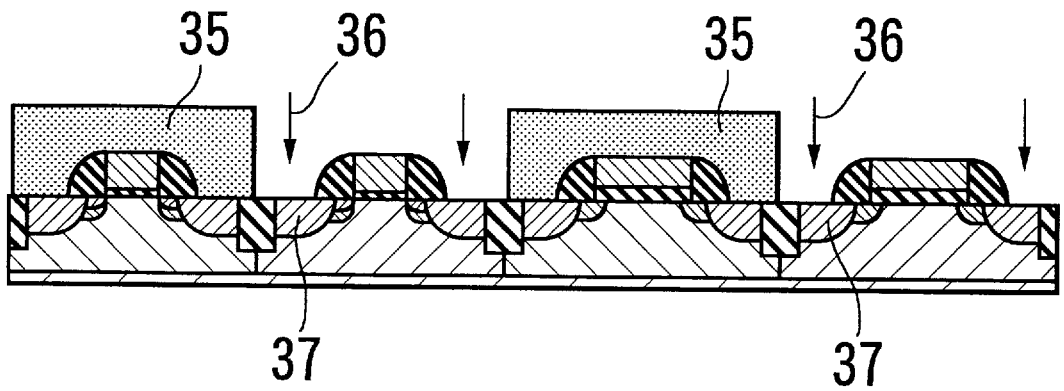
Figure 2A:
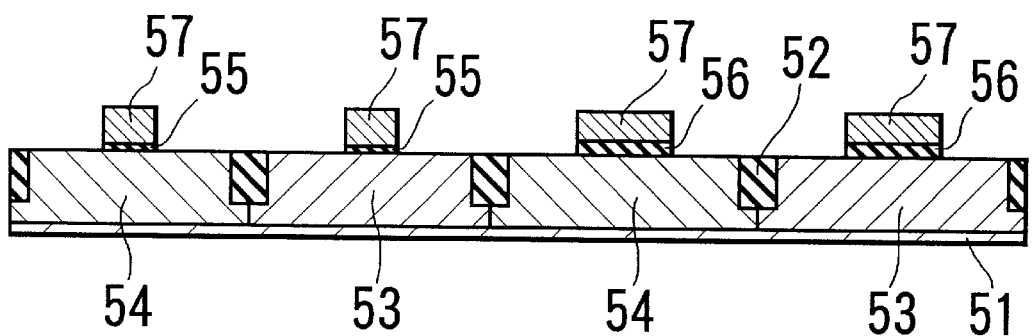
FIGS. 2A to 2H are sectional views showing another conventional semiconductor device manufacturing method in the order of the steps.
Figure 2B:
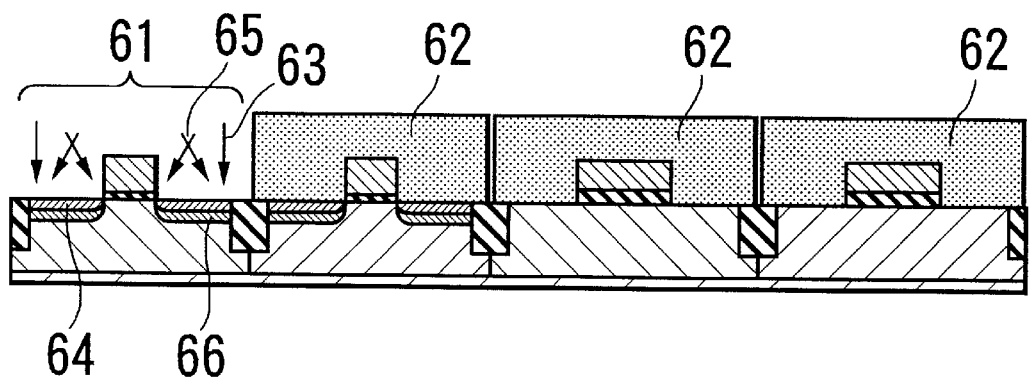
Figure 2C:
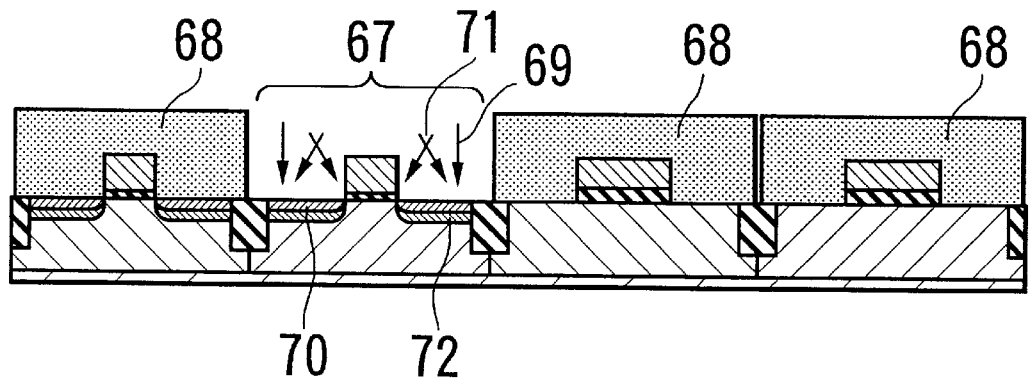
Figure 2D:
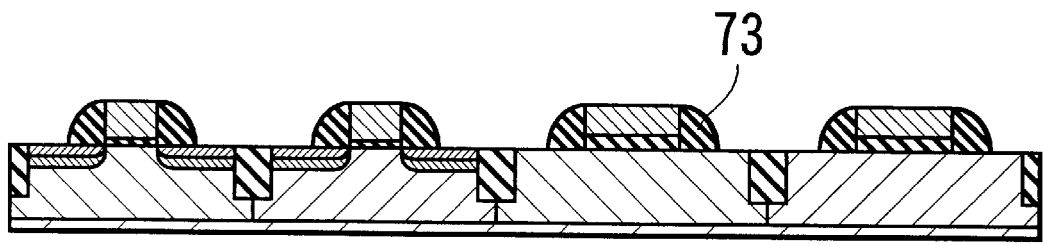
Figure 2E:
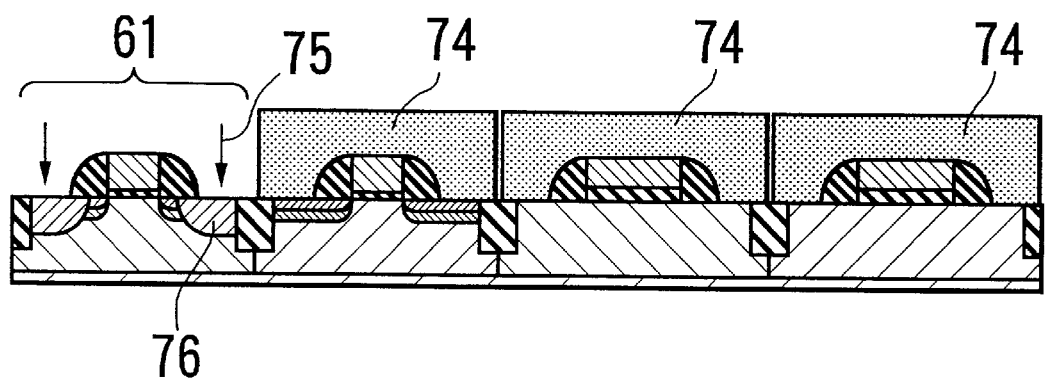
Figure 2F:
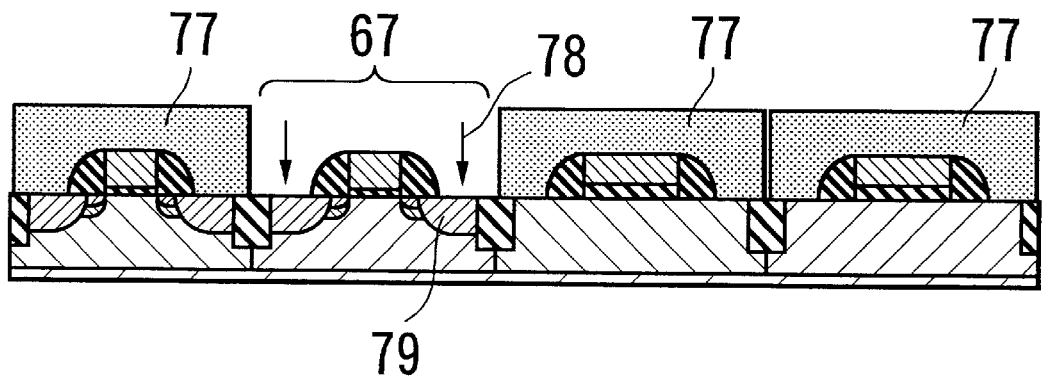
Figure 2G:
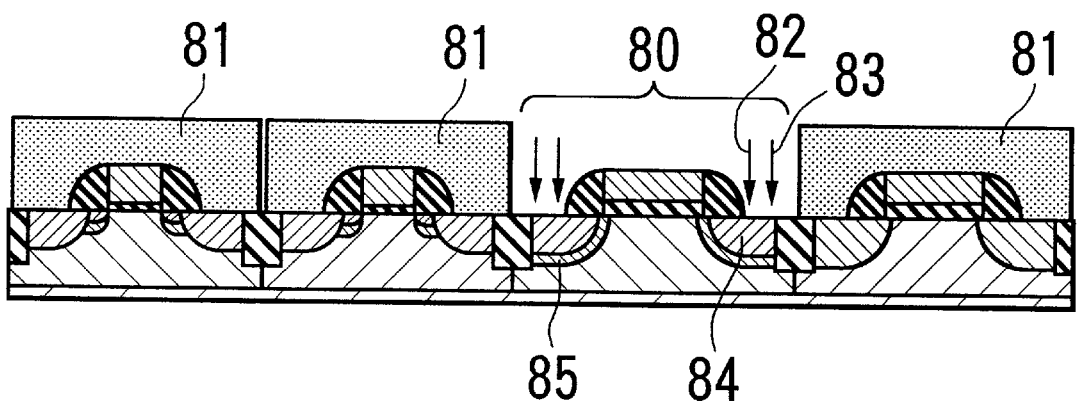
Figure 2H:
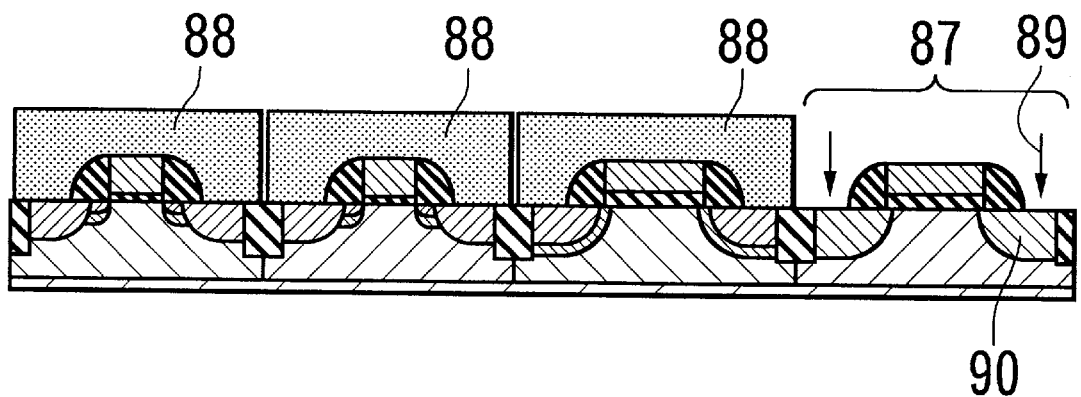
Figure 3A:
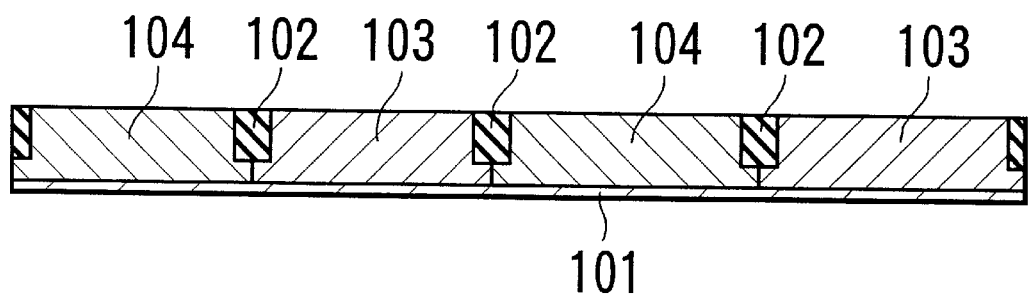
FIGS. 3A to 3H are sectional views showing a semiconductor device manufacturing method according to the first embodiment of the present invention in the order of the steps.

As shown in FIG. 3A, isolation regions 102 are formed in an Si <100> substrate 101 with a known technique, and n-type well regions 103 and p-type well regions 104 are formed.

The n-type well regions 103 are formed by ion-implanting, e.g., $P^+$ at an ion implantation energy of 700 keV, a dose of $1.5 \times 10^{13}$ cm$^{-2}$, and an implantation angle of 0°, $P^+$ at an ion implantation energy of 300 kev, a dose of $4 \times 10^{12}$ cm$^{-2}$, and an implantation angle of 0°, and after that $As^+$ at an ion implantation energy of 100 keV, a dose of $6 \times 10^{12}$ cm$^{-2}$, and an implantation angle of 0°.

The p-type well regions 104 are formed by ion-implanting, e.g., $B^+$ at an ion implantation energy of 300 keV, a dose of $2 \times 10^{13}$ cm$^{-2}$, and an implantation angle of 0°, $B^+$ at an ion implantation energy of 150 keV, a dose of $4 \times 10^{12}$ cm$^{-2}$, and an implantation angle of 0°, and after that $B^+$ at an ion implantation energy of 30 keV, a dose of $6 \times 10^{12}$ cm$^{-2}$, and an implantation angle of 0°.

Figure 3B:
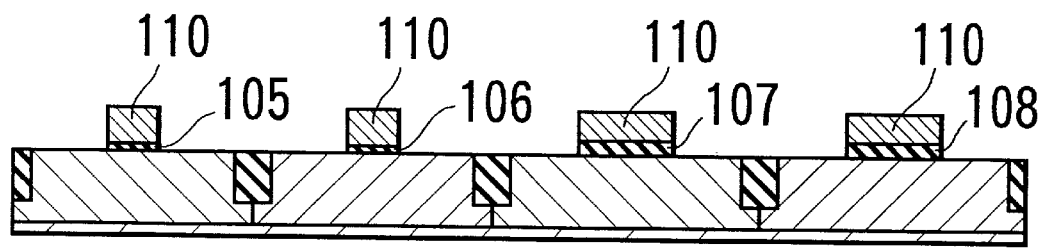

As shown in FIG. 3B, gate oxide films are formed by thermal oxidation or the like. In this case, by using a known technique, about 4 –nm thick gate oxide films 105 and 106 are formed at prospective 1.8 –V power supply voltage compatible MOSFET formation regions, and about 8 –nm thick gate oxide films 107 and 108 are formed at prospective 3.3 –V power supply voltage compatible MOSFET formation regions. After that, a polysilicon film having a thickness of about 150 nm is deposited. Then, gate electrodes 110 are formed by dry etching.

Figure 3C:
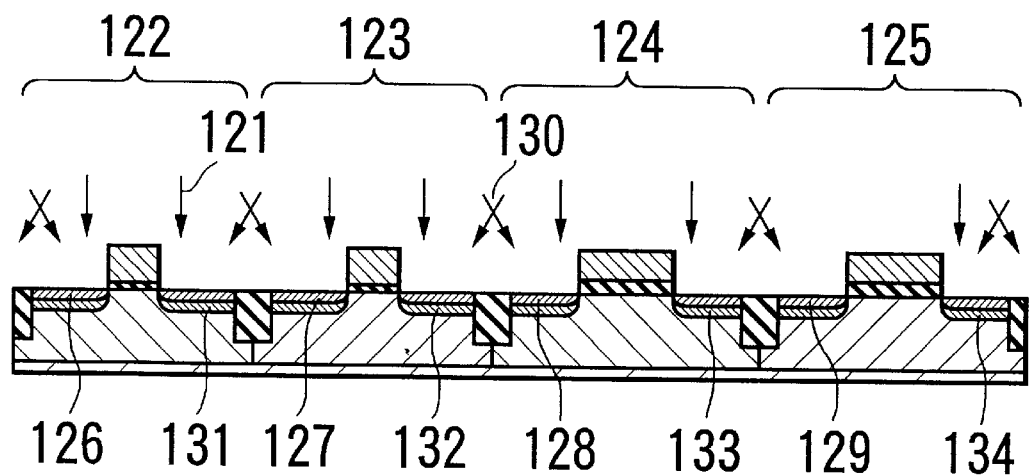

As shown in FIG. 3C, a p-type impurity $BF_2^+$ 121 is ion-implanted to the entire substrate surface at, e.g., an ion implantation energy of 5 keV, a dose of $1 \times 10^{14}$ cm$^{-2}$, and an implantation angle of 0°, to form p-type impurity regions 126, 127, 129, and 129 respectively in a prospective 1.8 –V power supply voltage compatible n-type MOSFET formation region 122, a prospective 1.8 –V power supply voltage compatible p-type MOSFET formation region 123, a prospective 3.3 –V power supply voltage compatible n-type MOSFET formation region 124, and a prospective 3.3 –V power supply voltage compatible p-type MOSFET formation region 125.

After that, oblique rotational implantation of an n-type impurity, e.g., $As^+$ 130, is performed at, e.g., an ion implantation energy of 70 keV, a dose of $2 \times 10^{13}$ cm$^{-2}$, and an implantation angle of 25°, to form n-type impurity regions 131, 132, 133, and 134 respectively in the prospective 1.8 –V power supply voltage compatible n-type MOSFET formation region 122, prospective 1.8 –V power supply voltage compatible p-type MOSFET formation region 123, prospective 3.3 –V power supply voltage compatible n-type MOSFET formation region 124, and prospective 3.3 –V power supply voltage compatible p-type MOSFET formation region 125.

$BF_2^+$ 121 and $As^+$ 130 employ the optimum ion implantation conditions to form the LDD and pocket of the 1.8 –V power supply voltage compatible p-type MOSFET.

Figure 3D:
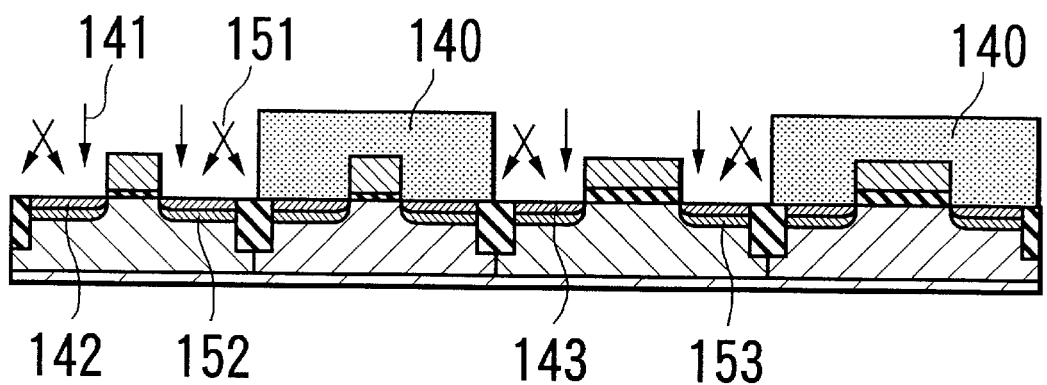

After that, as shown in FIG. 3D, by using the first photolithography step, the prospective 1.8 –V power supply voltage compatible p-type MOSFET formation region 123 and prospective 3.3 –V power supply voltage compatible p-type MOSFET formation region 125 are masked with resists 140, and an n-type impurity, e.g., $As^+$ 141, is ion-implanted at, e.g., an ion implantation energy of 10 keV, a dose of $4 \times 10^{14}$ cm$^{-2}$, and an implantation angle of 0° to invert the p-type impurity regions 126 and 128 formed by the step shown in FIG. 3C to n-type impurity regions 142 and 143.

After that, oblique rotational implantation of a p-type impurity, e.g., $BF_2^+$ 151, is performed at, e.g., an ion implantation energy of 30 keV, a dose of $4 \times 10^{13}$ cm$^{-2}$, and an implantation angle of 25° to invert the n-type impurity regions 131 and 133 formed by the step shown in FIG. 3C to p-type impurity regions 152 and 153.

$As^+$ 141 and $BF_2^+$ 151 employ the optimum ion implantation conditions to form the LDD and pocket of the 1.8 –V power supply voltage compatible n-type MOSFET.

Figure 3E:
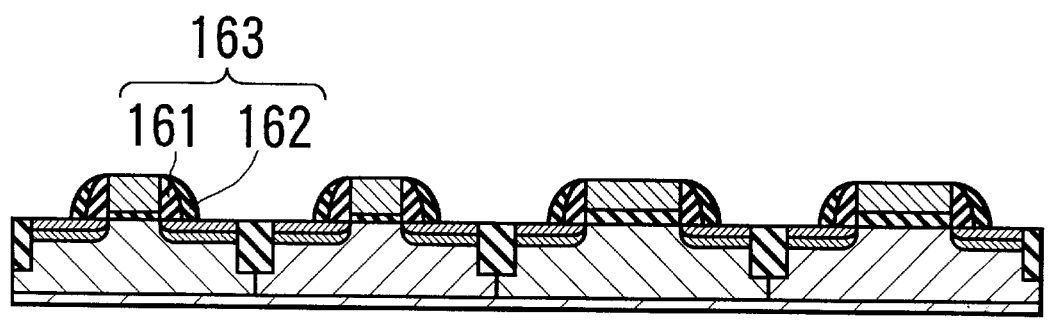

The resists 140 are removed. As shown in FIG. 3E, double side walls 163 each constituted by a silicon nitride side wall 161 and an $SiO_2$ side wall 162 are formed. The double side walls 163 can be formed in accordance with the following steps.

For example, a silicon nitride film having a thickness of about 50 nm is deposited by CVD, and anisotropic etching is performed by RIE to form the side walls 161 made of silicon nitride. An oxide film having a thickness of about 80 nm is deposited by CVD, and A anisotropic etching is performed by RIE to form the side walls 162 made of $SiO_2$. With these steps, the double side walls 163 each constituted by the silicon nitride side wall 161 and $SiO_2$ side wall 162 are formed.

Figure 3F:
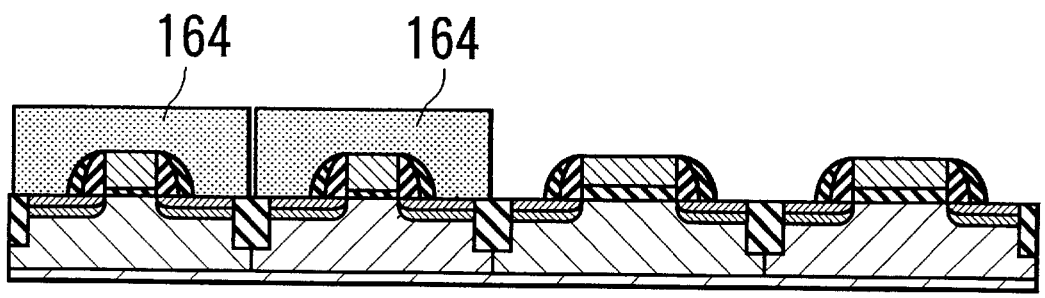

After that, as shown in FIG. 3F, by using the second photolithography step, the prospective 1.8 –V power supply voltage compatible n-type MOSFET formation region 122 and prospective 1.8 –V power supply voltage compatible p-type MOSFET formation region 123 are masked with resists 164, and the $SiO_2$ side walls 162 on the prospective 3.3 –V power supply voltage compatible n-type MOSFET formation region 124 and prospective 3.3 –V power supply voltage compatible p-type MOSFET formation region 125 are removed by wet etching.

Figure 3G:
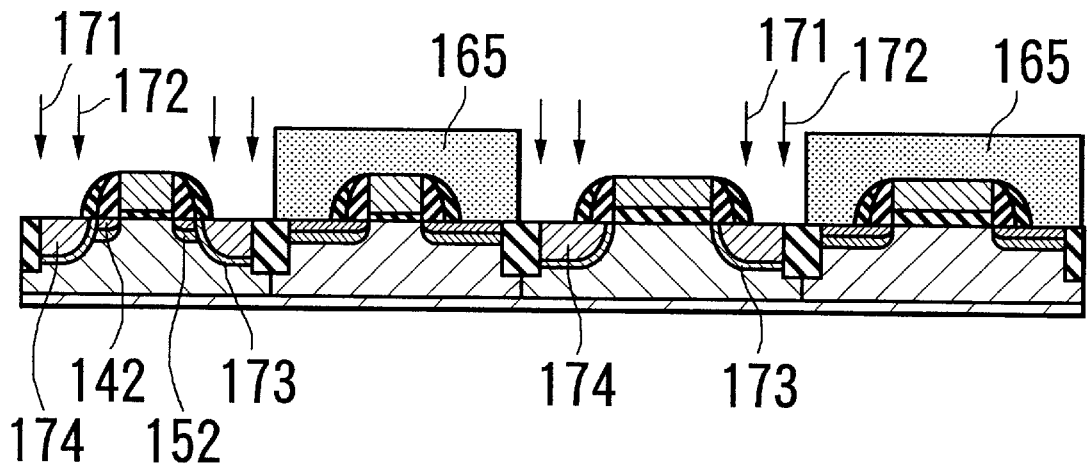

As shown in FIG. 3G, by using the third photolithography step, the prospective 1.8 –V power supply voltage compatible p-type MOSFET formation region 123 and prospective 3.3 –V power supply voltage compatible p-type MOSFET formation region 125 are masked with resists 165, and $P^+$ 171 is ion-implanted at an ion implantation energy of 30 keV, a dose of $1 \times 10^{15}$ cm$^{-2}$, and an implantation angle of 0°. Then, $As^+$ 172 is ion-implanted at an ion implantation energy of 50 keV, a dose of $5 \times 10^{15}$ cm$^{-2}$, and an implantation angle of 0°.

Through these steps, in the prospective 3.3 –V power supply voltage compatible n-type MOSFET formation region 124 having a thin side wall, $P^+$ 171 and $As^+$ 172 diffuse toward the gate rather than toward the n-type impurity region 143 and p-type impurity region 153 formed in FIG. 3D. Since $P^+$ 171 diffuses farther than $As^+$ 172, a DDD (Double Diffused Drain) structure composed of an n$^-$-type impurity region 173 and an n$^-$-type impurity region 174 is formed.

In the prospective 1.8 –V power supply voltage compatible n-type MOSFET formation region 122 having a thick side wall, the n-type impurity region 142 and p-type impurity region 152 formed in FIG. 3D exist near the gate end.

Figure 3H:
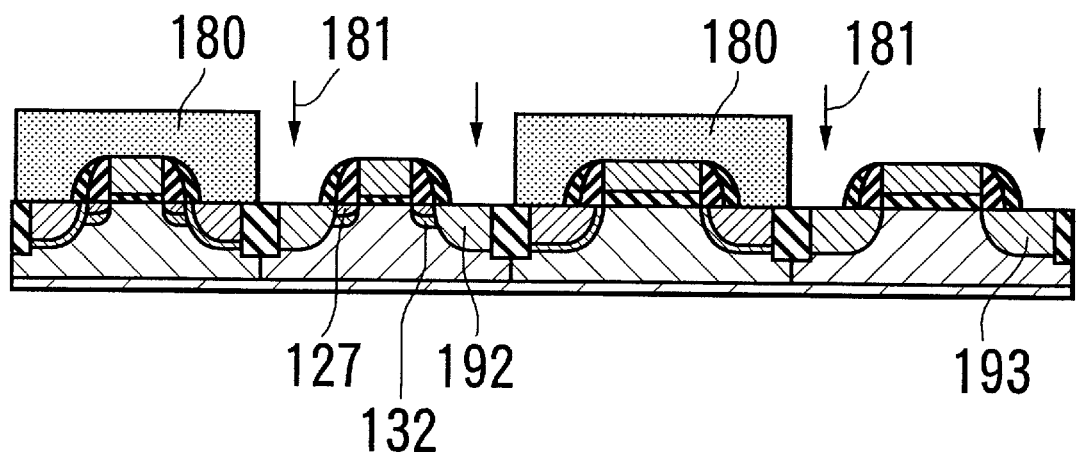

The resists 165 are removed. After that, as shown in FIG. 3H, by using the fourth photolithography step, the prospective 1.8 –V power supply voltage compatible n-type MOSFET formation region 122 and prospective 3.3 –V power supply voltage compatible n-type MOSFET formation region 124 are masked with resists 180, and B$^+$ 181 is ion-implanted at an ion implantation energy of 5 keV, a dose of 3×10$^{15}$ cm$^{-2}$, and an implantation angle of 0°.

As a result, source/drain regions 192 and 193 are formed in the prospective 1.8 –V power supply voltage compatible p-type MOSFET formation region 123 and prospective 3.3 –V power supply voltage compatible p-type MOSFET formation region 125.

Since the side wall is thin at the prospective 3.3 –V power supply voltage compatible p-type MOSFET formation region 125, the p-type impurity region 129 and n-type impurity region 134 formed in FIG. 3C are included in the p-type source/drain region 193. Accordingly, the 3.3 –V power supply voltage compatible p-type MOSFET has a single drain structure.

Since the side wall is thick at the prospective 1.8 –V power supply voltage compatible p-type MOSFET formation region 123, the p-type impurity region 127 and n-type impurity region 132 formed in FIG. 3C exist near the gate end.

After that, the resists 180 are removed, and the resultant structure is annealed for activation. An interlevel insulating film, interconnections, and the like are formed by a known technique to complete a CMOSFET.

Through the above steps, the 1.8 –V power supply voltage compatible n-type MOSFET and the 1.8 –V power supply voltage compatible p-type MOSFET form structures each having a comparatively heavily doped LDD region and a pocket region, the 3.3 –V power supply voltage compatible n-type MOSFET forms a DDD structure having a lightly doped n$^-$ region, and the 3.3 –V power supply voltage compatible p-type MOSFET forms a single drain structure.

In the above embodiment, the constituent materials and the respective types of numerals are not limited to those described above.

The second embodiment of the present invention will be described.

FIGS. 4A to 4J are sectional views showing a method of manufacturing a two-power supply voltage compatible CMOS semiconductor device according to the second embodiment of the present invention in the order of the manufacturing steps.

The second embodiment describes a case wherein 1.8 V and 3.3 V are used as the two different power supply voltages. In the description, the low power supply voltage region has a gate length of 0.18 μm, and the high power supply voltage region has a gate length of 0.35 μm.

Figure 4A:
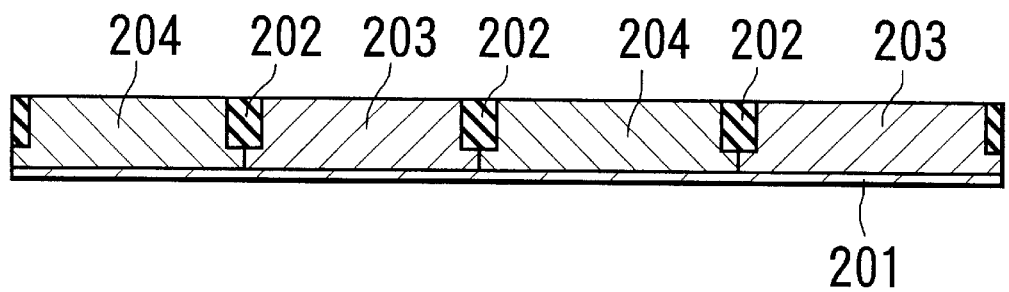
FIGS. 4A to 4J are sectional views showing a semiconductor device manufacturing method according to the second embodiment of the present invention in the order of the steps.

As shown in FIG. 4A, isolation regions 202 are formed in an Si <100> substrate 201 with a known technique, and n-type well regions 203 and p-type well regions 204 are formed.

The n-type well regions 203 are formed by ion-implanting, e.g., P$^+$ at an ion implantation energy of 700 keV, a dose of 1.5×10$^{13}$ cm$^{-2}$, and an implantation angle of 0°, P$^+$ at an ion implantation energy of 300 keV, a dose of 4×10$^{12}$ cm$^{-2}$, and an implantation angle of 0°, and after that As$^+$ at an ion implantation energy of 100 keV, at a dose of 6×10$^{12}$ cm$^{-2}$, and an implantation angle of 0°.

The p-type well regions 204 are formed by ion-implanting, e.g., B at an ion implantation energy of 300 keV, a dose of 2×10$^{13}$ cm$^{-2}$, and an implantation angle of 0°, B$^+$ at an ion implantation energy of 150 keV, a dose of 4×10$^{12}$ cm$^{-2}$, and an implantation angle of 0°, and after that B$^+$ at an ion implantation energy of 30 keV, at a dose of 6×10$^{12}$ cm$^{-2}$, and at an implantation angle of 0°.

Figure 4B:
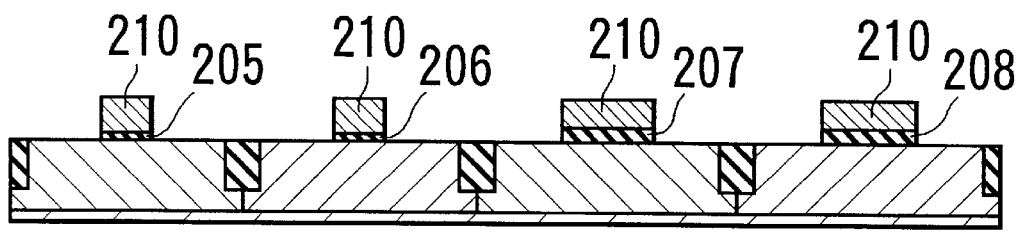

As shown in FIG. 4B, gate oxide films are formed by thermal oxidation or the like. In this case, by using a known technique, about 4 –nm thick gate oxide films 205 and 206 are formed at prospective 1.8 –V power supply voltage compatible MOSFET formation regions, and about 8 –nm thick gate oxide films 207 and 208 are formed at prospective 3.3 –V power supply voltage compatible MOSFET formation regions.

After that, a polysilicon film having a thickness of about 150 nm is deposited. Then, gate electrodes 210 are formed by dry etching.

Figure 4C:
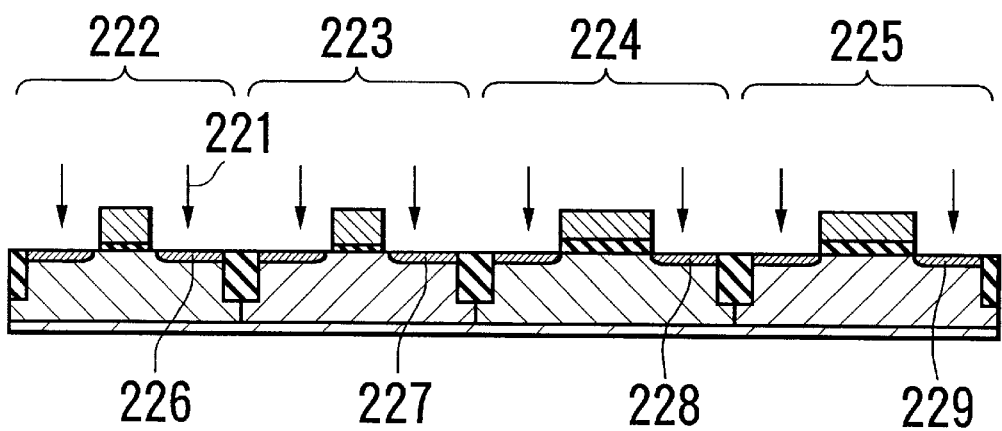

As shown in FIG. 4C, a p-type impurity BF$_2^+$ 221 is ion-implanted to the entire substrate surface at , e.g., an ion implantation energy of 5 keV, a dose of 1×10$^{14}$ cm$^{-2}$, and an implantation angle of 0°, to form p-type impurity regions 226, 227, 228, and 229 respectively in a prospective 1.8 –V power supply voltage compatible n-type MOSFET formation region 222, a prospective 1.8 –V power supply voltage compatible p-type MOSFET formation region 223, a prospective 3.3 –V power supply voltage compatible n-type MOSFET formation region 224, and a prospective 3.3 –V power supply voltage compatible p-type MOSFET formation region 225.

BF$_2^+$ 221 employs the optimum ion implantation conditions to form the LDD of the 1.8 –V power supply voltage compatible p-type MOSFET.

Figure 4D:
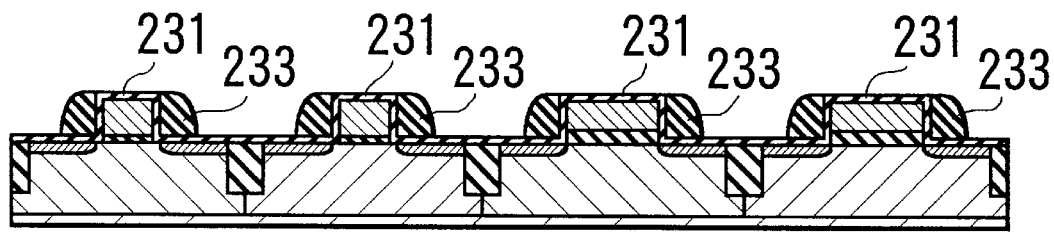

As shown in FIG. 4D, a silicon nitride film 231 having a thickness of about 5 nm is formed on the substrate surface, and an SiO$_2$ film having a thickness of about 100 nm is deposited. The SiO$_2$ film is etched back by RIE to form side walls 233 made of SiO$_2$.

Figure 4E:
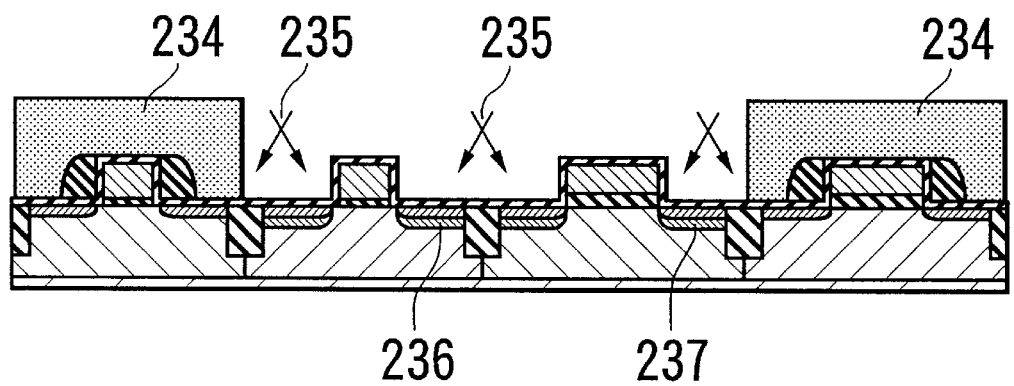

As shown in FIG. 4E, by using the first photolithography step, the prospective 1.8 –V power supply voltage compatible n-type MOSFET formation region 222 and prospective 3.3 –V power supply voltage compatible p-type MOSFET formation region 225 are masked with resists 234. The resultant structure is wet-etched with an aqueous solution of dilute hydrofluoric acid to remove the SiO$_2$ side walls 233 on the prospective 1.8 –V power supply voltage compatible p-type MOSFET formation region 223 and prospective 3.3 –V power supply voltage compatible n-type MOSFET formation region 224.

After that, oblique rotational implantation of an n-type impurity, e.g., As$^+$ 235, is performed at, e.g., an ion implantation energy of 70 keV, a dose of 2×10$^{13}$ cm$^{-2}$, and at an implantation angle of 25°, to form n-type impurity regions 236 and 237 respectively in the prospective 1.8 –V power supply voltage compatible p-type MOSFET formation region 223 and prospective 3.3 –V power supply voltage compatible n-type MOSFET formation region 224.

As$^+$ 235 employs the optimum ion implantation conditions to form the pocket of the 1.8 –V power supply voltage compatible p-type MOSFET.

Figure 4F:
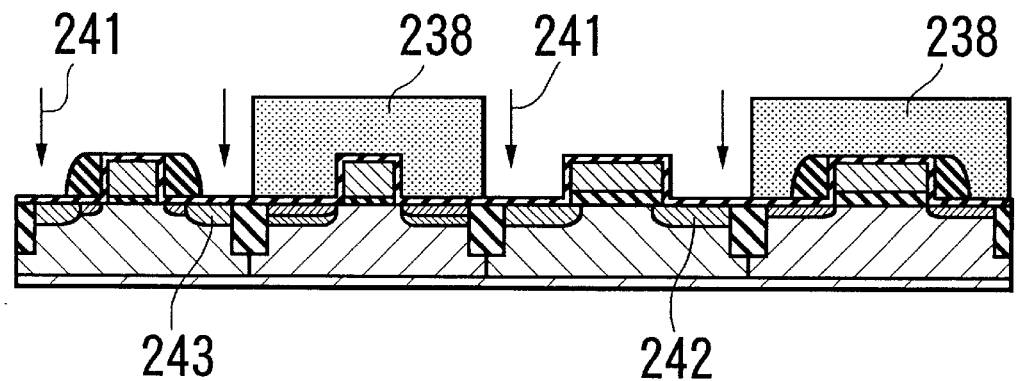

The resists 234 are removed. As shown in FIG. 4F, by using the second photolithography step, the prospective 1.8 –V power supply voltage compatible p-type MOSFET formation region 223 and prospective 3.3 –V power supply voltage compatible p-type MOSFET formation region 225 are masked with resists 238 and, e.g., P$^+$ 241 is ion-implanted at an ion implantation energy of 10 keV, a dose of 1×10$^{14}$ cm$^{-2}$, and an implantation angle of 0°.

Since no side wall exists at the prospective 3.3 –V power supply voltage compatible n-type MOSFET formation region 224, a lightly doped, broad-profile n-type LDD region 242 is formed at the gate end by phosphorus. The p-type impurity region 228 formed in FIG. 4C is also inverted to an n-type region to be included in the n-type LDD region 242.

Since a side wall exists at the prospective 1.8 –V power supply compatible n-type MOSFET formation region 222, a lightly doped, broad-profile n-type LDD region 243 does not extend to near the gate end.

P$^+$ 241 employs the optimum ion implantation conditions to form the LDD of the 3.3 –V power supply voltage compatible n-type MOSFET.

Figure 4G:
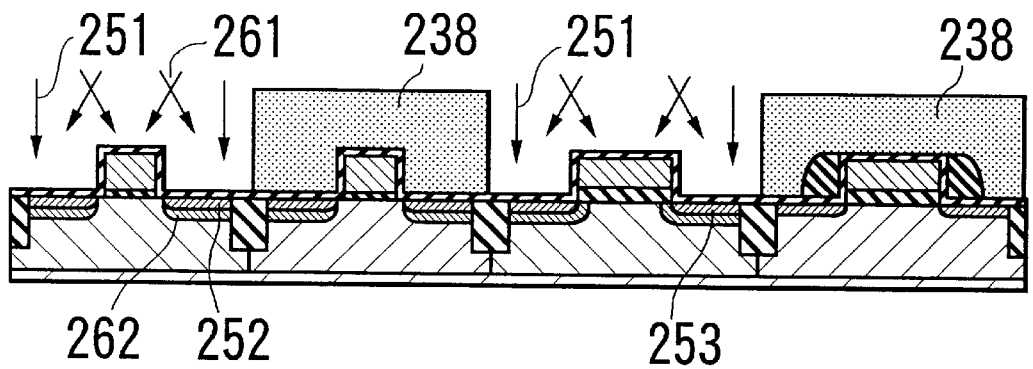

As shown in FIG. 4G, wet etching is performed with an aqueous solution of dilute hydrofluoric acid, with the resists 238 formed in the second photolithography step kept applied, to remove the SiO$_2$ side wall 233 on the prospective 1.8 –V power supply voltage compatible n-type MOSFET formation region 222.

Furthermore, an n-type impurity, e.g., As$^+$ 251, is ion-implanted at an ion implantation energy of 10 keV, a dose of $4\times10^{14}$ cm$^{-2}$, and an implantation angle of 0° to Pa form n-type impurity regions 252 and 253.

After that, oblique rotational implantation of a p-type impurity, e.g., BF$_2^+$ 261, is performed at an ion implantation energy of 30 keV, a dose of $4\times10^{13}$ cm$^{-2}$, and an implantation angle of 25° to form a p-type impurity region 262.

In the prospective 3.3 –V power supply voltage compatible n-type MOSFET formation region 224, since the concentration of the n-type LDD region 242 is higher than that of the p-type impurity to be implanted, a p-type impurity layer is not formed there.

As$^+$ 251 and BF$_2^+$ 261 employ the optimum ion implantation conditions to form the LDD and pocket of the 1.8 –V power supply voltage compatible n-type MOSFET.

Figure 4H:
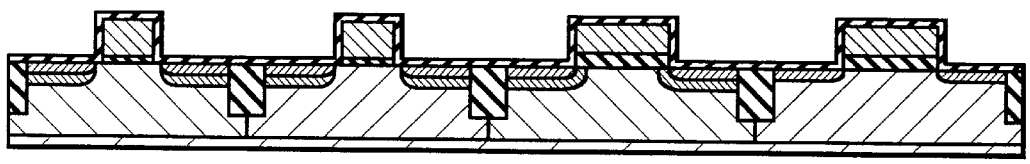

After that, as shown in FIG. 4H, the resists 238 are removed, and the SiO$_2$ side wall 233 on the prospective 3.3 –V power supply voltage compatible p-type MOSFET formation region 225 is removed.

Figure 4I:
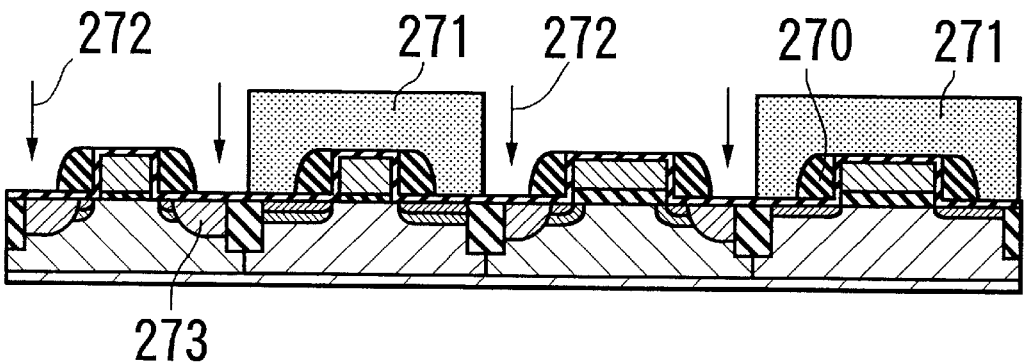

As shown in FIG. 4I, side walls 270 made of SiO$_2$ are formed again by, e.g., forming an oxide film having a thickness of about 120 nm by CVD and etching it back by RIE. Consequently, by using the third photolithography step, the prospective 1.8 –V power supply voltage compatible p-type MOSFET formation region 223 and prospective 3.3 –V power supply voltage compatible p-type MOSFET formation region 225 are masked with resists 271, and As$^+$ 272 is ion-implanted at an ion implantation energy of 50 keV, a dose of $5\times10^{15}$ cm$^{-2}$, and an implantation angle of 0° to form n-type source/drain regions 273.

Figure 4J:
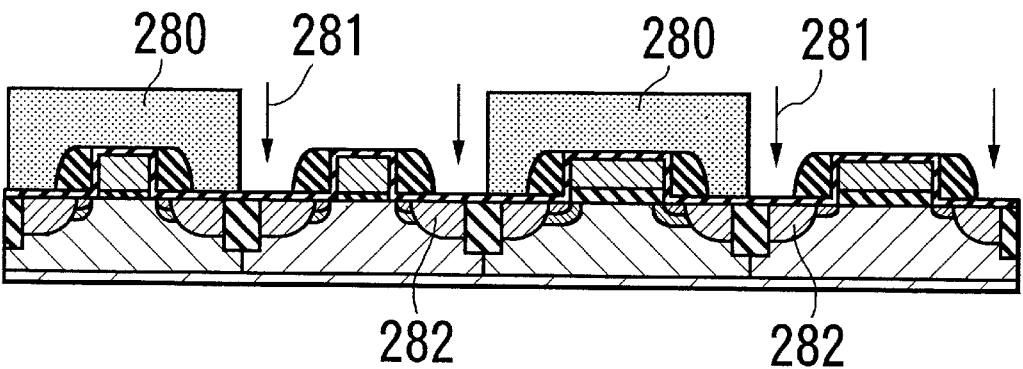

The resists 271 are then removed. As shown in FIG. 4J, by using the fourth photolithography step, the prospective 1.8 –V power supply voltage compatible n-type MOSFET formation region 222 and prospective 3.3 –V power supply voltage compatible n-type MOSFET formation region 224 are masked with resists 280, and B$^+$ 281 is ion-implanted at an ion implantation energy of 5 keV, a dose of $3\times10^{15}$ cm$^{-2}$, and an implantation angle of 0° to form p-type source/drain regions 282.

The resists 280 are removed, and the resultant structure is annealed for activation. An interlevel insulating film, interconnections, and the like are formed by a known technique to complete a CMOSFET.

Through the above steps, the 1.8 –V power supply voltage compatible n-type MOSFET and the 1.8 –V power supply voltage compatible p-type MOSFET form structures each having a comparatively heavily doped LDD region and a pocket region, the 3.3 –V power supply voltage compatible n-type MOSFET forms a structure having a lightly doped LDD region, and the 3.3 –V power supply voltage compatible p-type MOSFET forms an LDD structure having no pocket layer.

In the above embodiment, the constituent materials and the respective types of numerals are not limited to those described above.

What is claimed is:

1. A semiconductor device manufacturing method comprising:

the first step of forming a plurality of isolation regions in a semiconductor substrate, and thereafter forming a first p-type well region for a low power supply voltage compatible n-type MOSFET, a first n-type well region for a low power supply voltage compatible p-type MOSFET, a second p-type well region for a high power supply voltage compatible n-type MOSFET, and a second n-type well region for a high power supply voltage compatible p-type MOSFET that are isolated by said isolation regions;

after the first step, the second step of forming a gate oxide film to cover upper surfaces of said first n- and p-type well regions and said second n- and p-type well regions, depositing a polysilicon film on an upper surface of said gate oxide film, and forming gate electrodes by dry etching;

after the second step, the third step of ion-implanting a p-type impurity to an entire surface of said semiconductor substrate to form p-type impurity regions in said first n- and p-type well regions and in said second n- and p-type well regions to serve as a prospective low power supply voltage compatible n-type MOSFET formation region, a prospective low power supply voltage compatible p-type MOSFET formation region, a prospective high power supply voltage compatible n-type MOSFET formation region, and a prospective high power supply voltage compatible p-type MOSFET formation region, respectively, and ion-implanting an n-type impurity to said entire surface of said semiconductor substrate to form n-type impurity regions under said p-type impurity regions;

after the third step, the fourth step of masking said prospective low power supply voltage compatible p-type MOSFET formation region and said prospective high power supply voltage compatible p-type MOSFET formation region with resists by a first photolithography step, ion-implanting an n-type impurity to invert said p-type impurity region in said prospective low power supply voltage compatible n-type MOSFET formation region and said p-type impurity region in said prospective high power supply voltage compatible n-type MOSFET formation region to n-type impurity regions, and ion-implanting a p-type impurity to invert said n-type impurity region in said prospective low power supply voltage compatible n-type MOSFET formation region and said n-type impurity region in said prospective high power supply voltage compatible n-type MOSFET formation region to p-type impurity regions;

after the fourth step, the fifth step of removing said resists formed in the fourth step, and forming double side walls, each constituted by first and second side walls, at said prospective low power supply voltage compatible n-type MOSFET formation region, said prospective low power supply voltage compatible p-type MOSFET formation region, said prospective high power supply voltage compatible n-type MOSFET formation region, and said prospective high power supply voltage compatible p-type MOSFET formation region;

after the fifth step, the sixth step of masking said prospective low power supply voltage compatible p-type MOSFET formation region and said prospective low power supply voltage compatible n-type MOSFET formation region with resists by a second photolithography step, and removing said second side walls on said prospective high power supply voltage compatible n-type MOSFET formation region and said prospective high power supply voltage compatible p-type MOSFET formation region by wet etching;

after the sixth step, the seventh step of removing said resists formed in said sixth step, masking said prospective low power supply voltage compatible p-type MOSFET formation region and said prospective high power supply voltage compatible p-type MOSFET formation region with resists by a third photolithography step, and forming a DDD structure composed of an n⁻-type impurity region and an n⁺-type impurity region in said prospective high power supply voltage compatible n-type MOSFET formation region by impurity ion implantation, while forming a structure, in which said n- and p-type impurity regions formed in the fourth step exist near a gate end in said prospective low power supply voltage compatible n-type MOSFET formation region;

after the seventh step, the eighth step of removing said resists formed in the seventh step, masking said prospective low power supply voltage compatible n-type MOSFET formation region and said prospective high power supply voltage compatible n-type MOSFET formation region with resists by a fourth photolithography step, forming p-type source/drain regions in said prospective low power supply voltage compatible p-type MOSFET formation region and in said prospective high power supply voltage compatible p-type MOSFET formation region, and a single drain structure in said prospective high power supply voltage compatible p-type MOSFET formation region, by impurity ion implantation, while forming a structure, in which said p- and n-type impurity regions formed in the third step exist near said gate end in said prospective low power supply voltage compatible p-type MOSFET formation region; and after the eighth step, the ninth step of removing said resists formed in the eighth step, and performing annealing for activation.

2. A semiconductor device manufacturing method comprising:

the first step of forming an isolation region in a semiconductor substrate, and thereafter forming a first p-type well region for a low power supply voltage compatible n-type MOSFET, a first n-type well region for a low power supply voltage compatible p-type MOSFET, a second p-type well region for a high power supply voltage compatible n-type MOSFET, and a second n-type well region for a high power supply voltage compatible p-type MOSFET that are isolated by said isolation region;

after the first step, the second step of forming a gate oxide film to cover upper surfaces of said first n- and p-type well regions and said second n- and p-type well regions, depositing a polysilicon film on an upper surface of said gate oxide film, and forming gate electrodes by dry etching;

after the second step, the third step of ion-implanting a p-type impurity to an entire surface of said semiconductor substrate to form p-type impurity regions in said first n- and p-type well regions and in said second n- and p-type well regions to serve as a prospective low power supply voltage compatible n-type MOSFET formation region, a prospective low power supply voltage compatible p-type MOSFET formation region, a prospective high power supply voltage compatible n-type MOSFET formation region, and a prospective high power supply voltage compatible p-type MOSFET formation region, respectively;

after the third step, the fourth step of forming a first insulating film on said entire surface of said semiconductor substrate, depositing a second insulating film, and etching-back said second insulating film by RIE to form first side walls;

after the fourth step, the fifth step of masking said prospective low power supply voltage compatible n-type MOSFET formation region and said prospective high power supply voltage compatible p-type MOSFET formation region with resists by a first photolithography step, removing said first side walls on said prospective low power supply voltage compatible p-type MOSFET formation region and on said prospective high power supply voltage compatible n-type MOSFET formation region by wet etching, and thereafter ion-implanting an n-type impurity to form n-type impurity regions in said prospective low power supply voltage compatible p-type MOSFET formation region and said prospective high power supply voltage compatible n-type MOSFET formation region;

after the fifth step, the sixth step of removing said resists formed in said fifth step, masking said prospective low power supply voltage compatible p-type MOSFET formation region and said prospective high power supply voltage compatible p-type MOSFET formation region with resists by a second photolithography step, and forming a lightly doped, broad-profile n-type LDD region at a gate end of said prospective high power supply voltage compatible n-type MOSFET formation region by impurity ion implantation, while forming a lightly doped, broad-profile n-type impurity region not reaching said gate end in said prospective low power supply voltage compatible n-type MOSFET formation region;

after the sixth step, the seventh step of removing said first side wall on said prospective low power supply voltage compatible n-type MOSFET formation region by wet etching, ion-implanting an n-type impurity to form n-type impurity regions in said prospective low power supply voltage compatible n-type MOSFET formation region and in said prospective high power supply voltage compatible n-type MOSFET formation region, and thereafter ion-implanting a p-type impurity at a concentration lower than in said n-type LDD region to form a p-type impurity region in said prospective low power supply voltage compatible n-type MOSFET formation region;

after the seventh step, the eighth step of removing said resists formed in said sixth step, and removing said first side wall on said prospective high power supply voltage compatible p-type MOSFET formation region;

after the eighth step, the ninth step of depositing an SiO$_2$ film on said entire surface of said semiconductor substrate, etching back said SiO$_2$ film by RIE to form second side walls, thereafter masking said prospective low power supply voltage compatible p-type MOSFET formation region and said prospective high power supply voltage compatible p-type MOSFET formation region with resists by a third photolithography step, and ion-implanting an impurity to form n-type source/drain regions in said prospective low power supply voltage compatible n-type MOSFET formation region and in said prospective high power supply voltage compatible n-type MOSFET formation region;

after the ninth step, the 10th step of removing said resists formed in the eighth step, masking said prospective low power supply voltage compatible n-type MOSFET formation region and said prospective high power supply voltage compatible n-type MOSFET formation region with resists by a fourth photolithography step, and forming p-type source/drain regions in said prospective low power supply voltage compatible p-type MOSFET formation region and in said prospective high power supply voltage compatible p-type MOSFET formation region by impurity ion implantation; and after the 10th step, the 11th step of removing said resists formed in the 10th step, and performing annealing for activation.

3. A method according to claim 1, wherein said low power supply voltage compatible n-type MOSFET in said prospective low power supply voltage compatible n-type MOSFET formation region and said low power supply voltage compatible p-type MOSFET in said prospective low power supply voltage compatible p-type MOSFET formation region form structures each having a comparatively heavily doped LDD region and a pocket region, said high power supply voltage compatible n-type MOSFET in said prospective high power supply voltage compatible n-type MOSFET formation region forms a DDD structure having a lightly doped n region, and said high power supply voltage compatible p-type MOSFET in said prospective high power supply voltage compatible p-type MOSFET formation region forms a single drain structure.

4. A method according to claim 2, wherein said low power supply voltage compatible n-type MOSFET in said prospective low power supply voltage compatible n-type MOSFET formation region and said low power supply voltage compatible p-type MOSFET in said prospective low power supply voltage compatible p-type MOSFET formation region form structures each having a comparatively heavily doped LDD region and a pocket region, said high power supply voltage compatible n-type MOSFET in said prospective high power supply voltage compatible n-type MOSFET formation region forms a structure having a lightly doped LDD region, and said high power supply voltage compatible p-type MOSFET in said prospective high power supply voltage compatible p-type MOSFET formation region forms an LDD structure having no pocket layer.

5. A method according to claim 1, wherein said semiconductor substrate is an Si <100> substrate.

6. A method according to claim 2, wherein said semiconductor substrate is an Si <100> substrate.

7. A method according to claim 1, wherein said low power supply voltage compatible n-type MOSFET in said prospective low power supply voltage compatible n-type MOSFET formation region and said low power supply voltage compatible p-type MOSFET in said prospective low power supply voltage compatible p-type MOSFET formation region are 1.8 –V power supply voltage compatible MOSFETs, and said high power supply voltage compatible n-type MOSFET in said prospective high power supply voltage compatible n-type MOSFET formation region and said high power supply voltage compatible p-type MOSFET in said prospective high power supply voltage compatible p-type MOSFET formation region are 3.3 –V power supply voltage compatible MOSFETs.

8. A method according to claim 2, wherein said low power supply voltage compatible n-type MOSFET in said prospective low power supply voltage compatible n-type MOSFET formation region and said low power supply voltage compatible p-type MOSFET in said prospective low power supply voltage compatible p-type MOSFET formation region are 1.8 –V power supply voltage compatible MOSFETs, and said high power supply voltage compatible n-type MOSFET in said prospective high power supply voltage compatible n-type MOSFET formation region and said high power supply voltage compatible p-type MOSFET in said prospective high power supply voltage compatible p-type MOSFET formation region are 3.3 –V power supply voltage compatible MOSFETs.

9. A method according to claim 2, wherein said first insulating film is a silicon nitride film.

10. A method according to claim 2, wherein said second insulating film is an SiO$_2$ film.

* * * * *